United States Patent
Huang

(10) Patent No.: US 10,622,975 B2
(45) Date of Patent: Apr. 14, 2020

(54) VOLTAGE TRANSLATOR USING LOW VOLTAGE POWER SUPPLY

(71) Applicant: SEMICONDUCTOR COMPONENTS INDUSTRIES, LLC, Phoenix, AZ (US)

(72) Inventor: Lei Huang, Sunnyvale, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/005,216

(22) Filed: Jun. 11, 2018

(65) Prior Publication Data

US 2019/0379366 A1    Dec. 12, 2019

(51) Int. Cl.
*H03K 3/356* (2006.01)

(52) U.S. Cl.
CPC .......... *H03K 3/356147* (2013.01); *H03K 2217/0054* (2013.01)

(58) Field of Classification Search
None
See application file for complete search history.

(56) References Cited

U.S. PATENT DOCUMENTS

| | | | |
|---|---|---|---|
| 5,696,728 A | 12/1997 | Yu et al. | |
| 6,967,518 B2 | 11/2005 | Giacomini et al. | |
| 8,149,017 B2 | 4/2012 | Knierim | |
| 10,128,846 B2 * | 11/2018 | Mallavajula | H03K 19/0013 |
| 2004/0113677 A1 * | 6/2004 | Clark | H03K 3/356156 327/333 |
| 2005/0184757 A1 * | 8/2005 | Skroch | G06F 1/06 326/63 |
| 2006/0066381 A1 | 3/2006 | Bhattacharya et al. | |
| 2014/0152369 A1 | 6/2014 | Qi | |
| 2015/0109036 A1 * | 4/2015 | Gomm | H03K 3/017 327/158 |
| 2016/0182053 A1 * | 6/2016 | Aipperspach | G06F 17/505 326/81 |
| 2017/0288673 A1 * | 10/2017 | Nadkarni | G06F 1/3296 |

* cited by examiner

*Primary Examiner* — Cassandra F Cox
(74) *Attorney, Agent, or Firm* — Brake Hughes Bellermann LLP

(57) ABSTRACT

A voltage translation device is disclosed. The voltage translation device includes an input circuit, operating in a first voltage domain, that is configured to receive an input signal. The voltage translation device also includes an output circuit, operating in a second voltage domain, that includes a latch circuit. The voltage translation device also includes a driver circuit that is controlled by the input circuit to pass a voltage from the first voltage domain to the latch circuit in order to trigger the latch circuit to output an output signal in the second voltage domain according to the input signal in the first voltage domain.

20 Claims, 8 Drawing Sheets

VOLTAGE TRANSLATOR USING LOW VOLTAGE POWER SUPPLY

FIELD OF THE DISCLOSURE

The present disclosure relates to voltage translators and more specifically to a voltage translator capable of operating with a low voltage power supply.

BACKGROUND

Many applications have different power domains and use a translator to translate a signal from one power domain (e.g., a low voltage power domain) to another power domain (e.g., a high voltage power domain). Some translators may not be capable of appropriately translating a signal from one power domain to another power domain, especially when the voltage supplied to the translator is low. Thus, a need exists for an apparatus and method to address the shortfalls of present technology and provide other new and innovative features.

SUMMARY

In one general aspect, the present disclosure is related to a voltage translation device. The voltage translation device includes an input circuit, operating in a first voltage domain, that is configured to receive an input signal. The voltage translation device also includes an output circuit, operating in a second voltage domain, that includes a latch circuit. The voltage translation device also includes a driver circuit that is controlled by the input circuit to pass a voltage from the first voltage domain to the latch circuit in order to trigger the latch circuit to output an output signal in the second voltage domain according to the input signal in the first voltage domain.

The foregoing illustrative summary, as well as other exemplary objectives and/or advantages of the disclosure, and the manner in which the same are accomplished, are further explained within the following detailed description and its accompanying drawings.

DETAILED DESCRIPTION

Voltage translation devices (i.e., voltage translators, voltage level translators, translator, etc.) may be used to connect devices or systems operating in different power domains. These devices receive an input signal (e.g., a digital signal) that has high and low voltages (i.e., input voltages) in a first voltage domain. The devices output an output signal having the same low-to-high and high-to-low transitions as the input signal but with high and low voltages (i.e., output voltages) in the second voltage domain. In other words, the output signal is a voltage translated version of the input signal.

The voltage translation devices described herein can include a driver circuit that utilizes one or more pass gates to pass a voltage from a circuit operating in the first voltage domain to a circuit operating in a second voltage domain. In other words, one or more pass gates are provided as a way for a circuit operating in a first voltage domain to control the switching of a circuit operating in the second voltage domain. The pass gates are effective because they can control a switching voltage in the second voltage domain directly without competition from other driving circuits. In other words, a pass gate attempting to pull down a switching voltage does not have to overcome a driving current attempting to pull up the switching voltage. This approach insures proper switching control regardless of threshold voltages associated with switching devices in either circuit, and is thus suitable for low power supply voltages. Further, the disclosed approach may exclude external capacitors for AC coupling between the first and the second voltage domains (e.g., to reduce propagation delay) because an AC coupling aspect is included in the pass gate operation.

Figure 1:
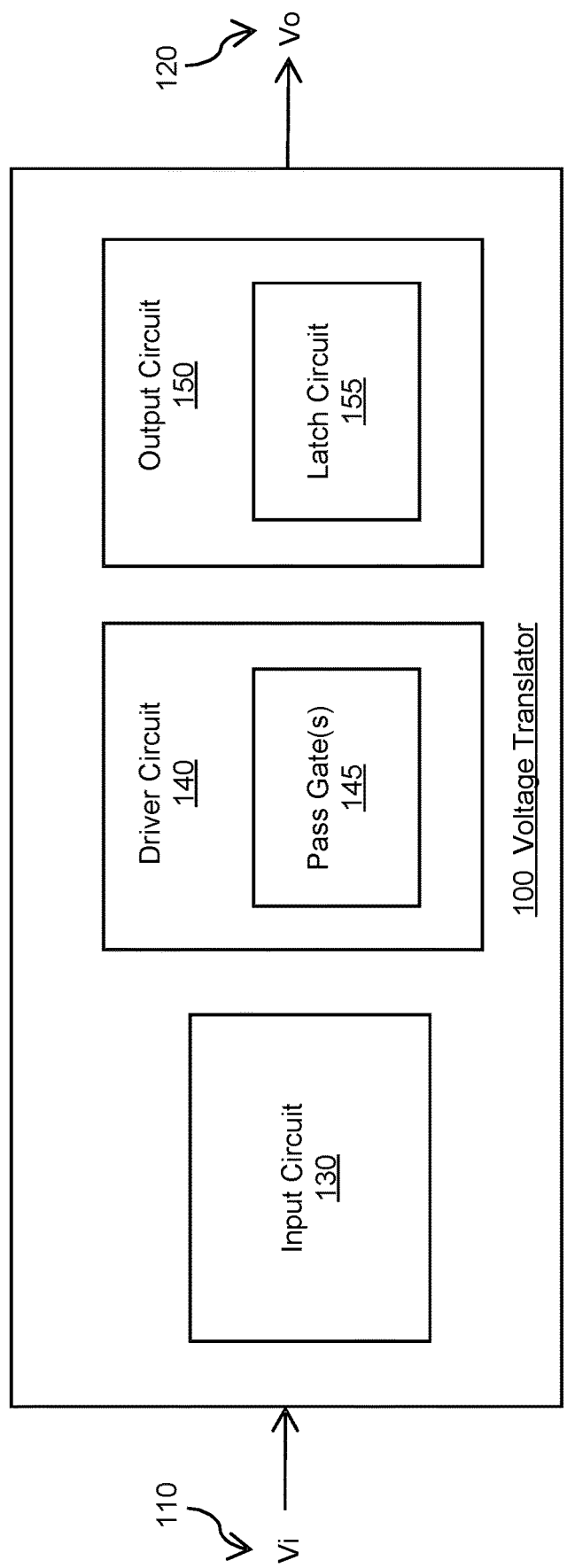
FIG. 1 is a diagram that illustrates a voltage translation device according to an embodiment of the present disclosure.

FIG. 1 illustrates a diagram of a voltage translator 100. The voltage translator receives an input signal, Vi, 110 in a first voltage domain and outputs an output signal, Vo, 120 in a second voltage domain. The voltage translator 100 includes an input circuit 130 operating in the first voltage domain that receives the input signal and, based on the input signal, controls a driver circuit 140. The driver circuit 140 controls an output circuit 150 operating in the second voltage domain to output the output signal, Vo, 120 according to the input signal, Vi, 110.

The output circuit 150 includes a latch circuit (i.e., latch) 155. The latch 155 can be configured to output an output signal based on its voltage state. Changing the voltage state of the latch requires turning a switching device in the latch circuit ON/OFF. Accordingly, the driver circuit 140 includes one or more pass gates 145. The pass gates may be controlled to pass a voltage from the first voltage domain to turn ON/OFF a switch in the latch to change the voltage state of the latch. The pass gates can be used to change the state of latch circuit even in voltage translation scenarios in which the power supplied is low.

Figure 2A:
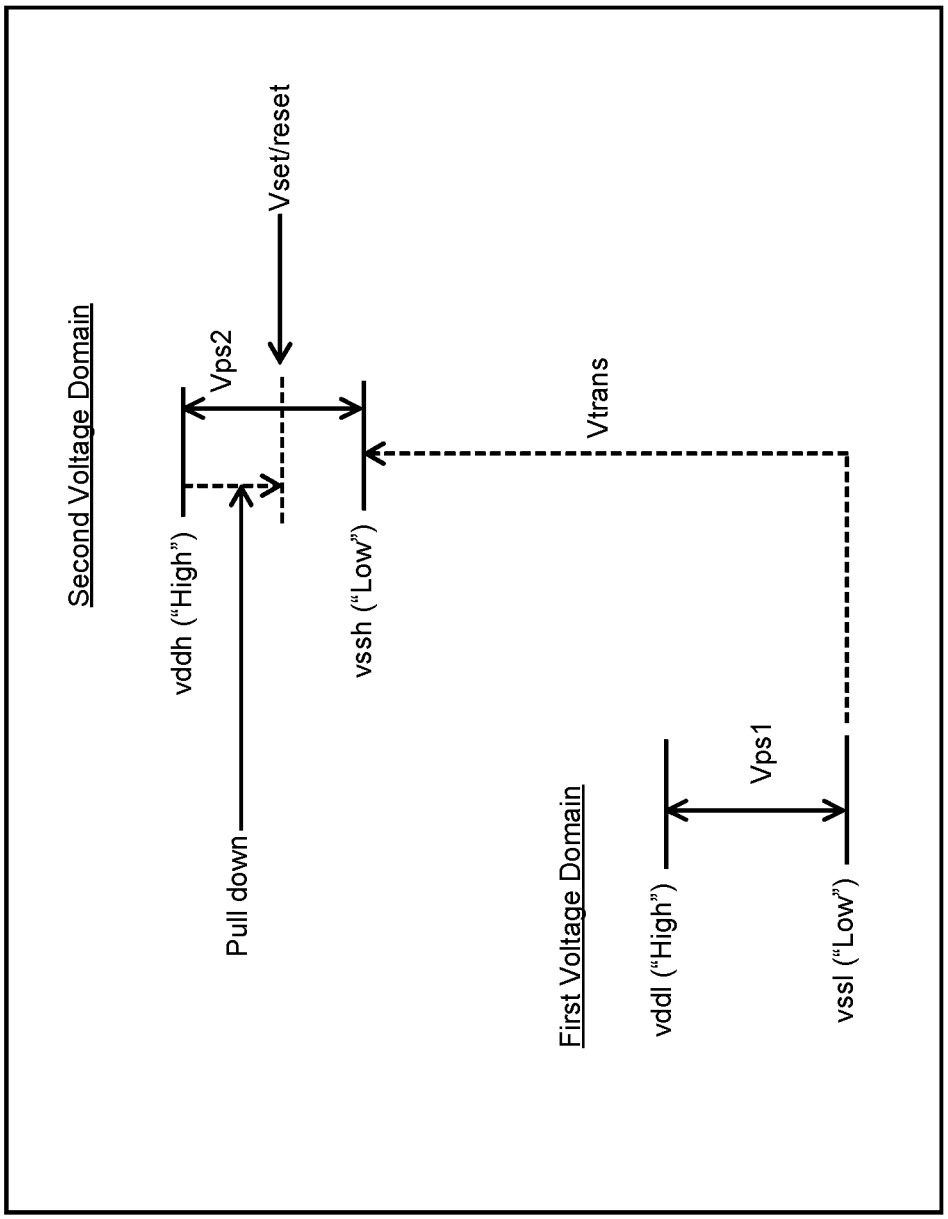
FIG. 2A graphically depicts a low-to-high voltage translation scenario in terms of voltage levels.
Figure 2B:
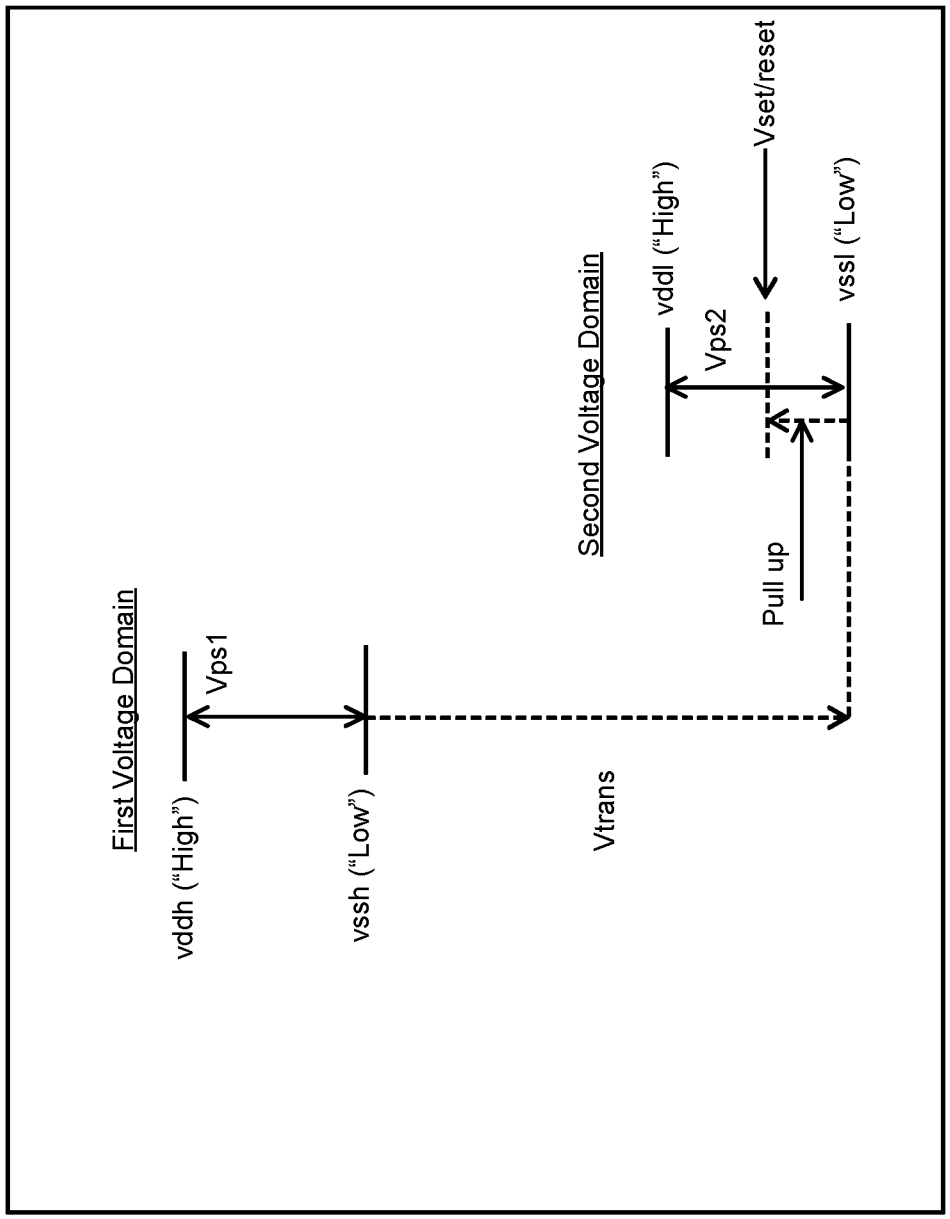
FIG. 2B graphically depicts a high-to-low voltage translation scenario in terms of voltage levels.

A voltage translation scenario (i.e., low-to-high translation) with a low voltage (e.g., less than 2V) power supply (i.e., Vps1) is graphically depicted in FIG. 2A, while FIG. 2B illustrates another voltage translation scenario (i.e., high-to-low translation). As will be discussed later, the voltage translation device disclosed may be embodied to provide either a low-to-high translation (e.g., FIG. 5) or a high-to-low translation (e.g., FIG. 6).

As shown in FIG. 2A, the first voltage domain includes voltages spanning a lower rail voltage, vssl, of the first voltage domain and an upper rail voltage, vddl, of the first voltage domain (i.e., vddl−vssl=Vps1). The second voltage domain includes voltages spanning a lower rail voltage, vssh, of the first voltage domain and an upper rail voltage, vddh, of the second voltage domain (i.e., vddh−vssh=Vps2). The driver circuit 140, including the pass gates 145 as shown in FIG. 1, prevents latch switching problems when voltages supplied (i.e., Vps1 and/or Vps2) are small (e.g., less than 2 volts) and/or when the amount of voltage translation (i.e., Vtrans) is large (e.g., more than 10 volts).

Latch switching (e.g., of the latch circuit 155) problems can be related, in part, to the switching devices typically used to pull-down a portion of a circuit to a low voltage or to pull-up a portion of a circuit to a high voltage in order to turn ON/OFF a switch (e.g., to control the state of the latch). Switching devices used in voltage translators may have a relatively high (e.g., 1.2 volts) threshold voltage (Vth) that can limit the amount of a voltage pull-up or a voltage pull-down. For example, if a voltage supplied is 1.8 volts (V) and the threshold voltage of a switching device operating in this domain is 1.2 V, then the voltage of 1.8 V may only be pulled down by 0.6 V due to the threshold voltage required by the switching device. This amount of voltage pull-down is insufficient to change an ON/OFF state of switch in the latch operating in the 1.8 V domain. The pass gate 145 eliminates this problem by passing a voltage from the first voltage domain directly to a gate of a switch operating in the second voltage domain.

Figure 3:
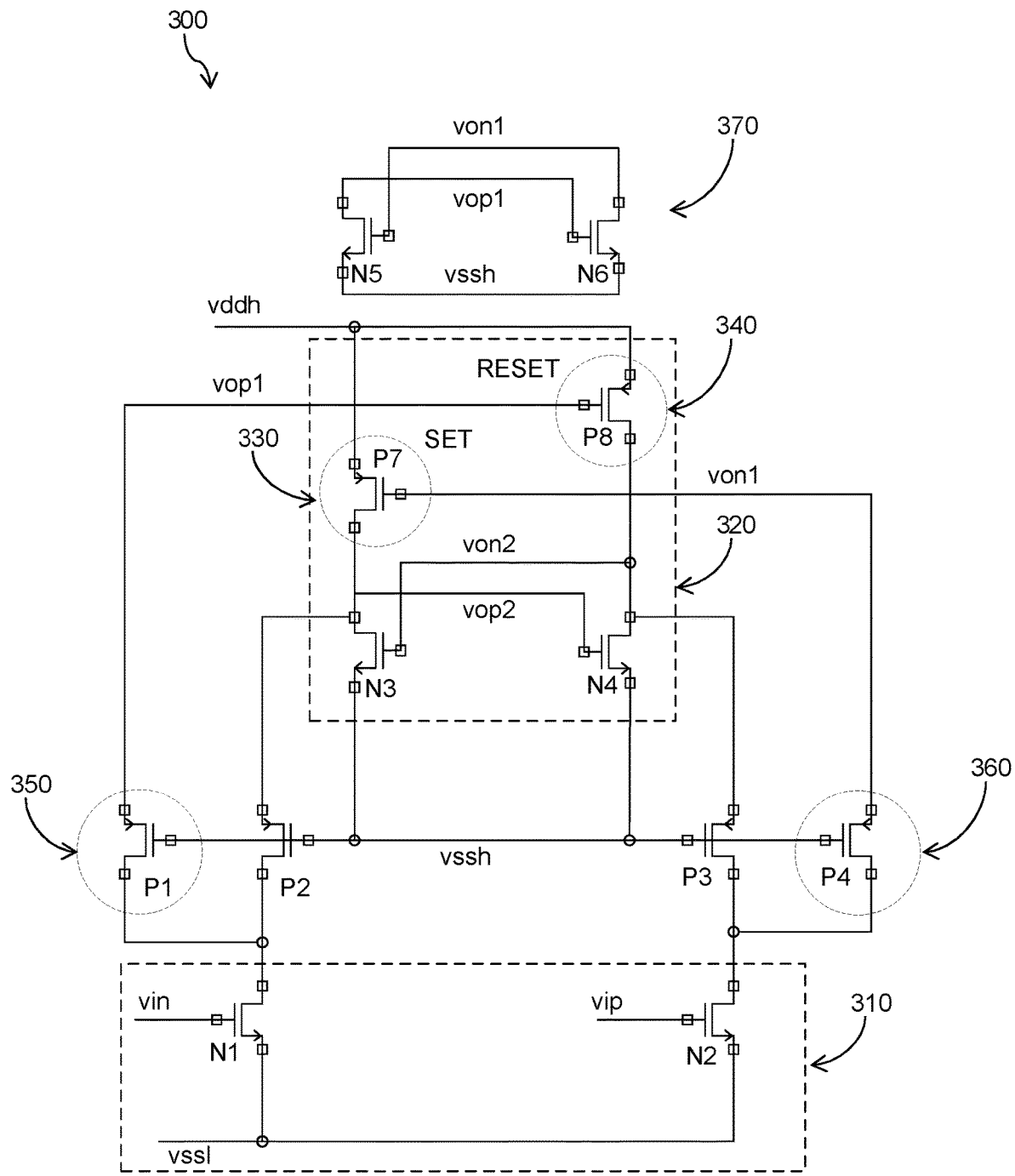
FIG. 3 schematically depicts a voltage translation device according to an embodiment of the present disclosure.

FIG. 3 schematically depicts an example embodiment of a voltage translation device 300. In this case, the voltage translation device translates an input signal in a LV domain defined by a lower rail voltage, vssl, and an upper rail voltage, vddl (not shown), to an output signal in a HV domain defined by lower rail voltage, vssh, and an upper rail voltage, vddh.

Figure 4:
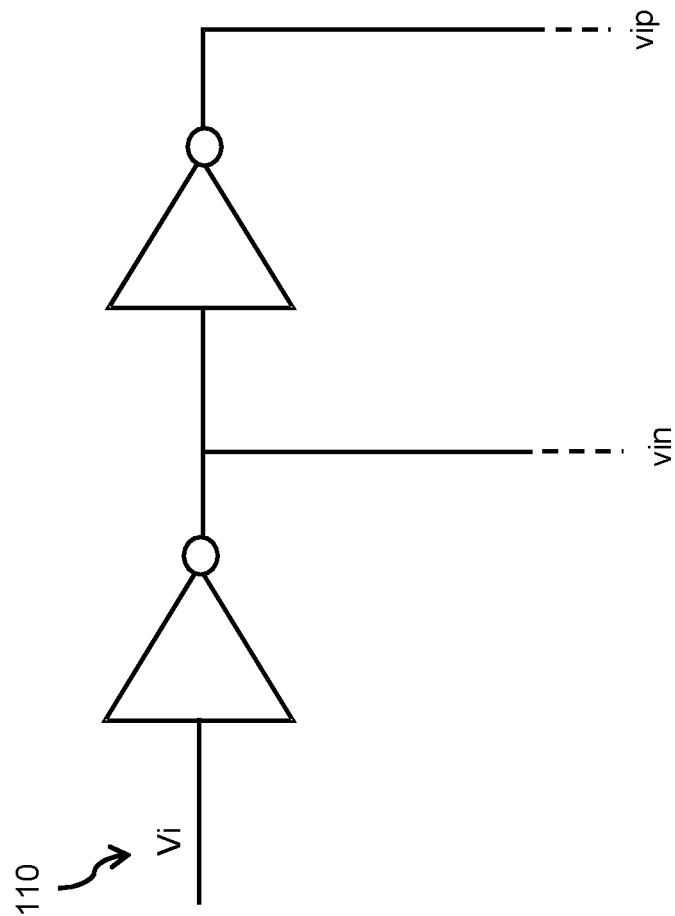
FIG. 4 schematically illustrates a portion of an input circuit for a voltage translator, such as that shown in FIG. 3.

The voltage translation device 300 includes an input circuit 310. The input circuit may receive complimentary inputs vin and vip from a portion of the input circuit shown in FIG. 4. As shown in FIG. 4, when an input signal 110, Vi, is high then vin is low and vip is high. Also as shown in FIG. 4, when the input signal 110, Vi, is low then vin is high and vip is low.

Returning to FIG. 3, the input circuit 310 can include a first input switch, N1, that is turned ON when the input signal, Vin, is a low (i.e., vin is high) and turned OFF when the input signal, Vin, is high (i.e., vin is low). The input circuit 310 also includes a second input circuit switch, N2, that is turned ON when Vin is high (i.e., vip is high) and turned OFF when the Vin is low (i.e., vip is low).

The voltage translation device 300 also includes a latch circuit 320. The latch circuit 320 includes a set-latch switch 330 and a reset-latch switch 340. The output signal, vop2, of the latch circuit 320 is a high voltage in the second voltage domain (e.g., vddh) when the set set-latch switch is turned ON, and the output signal of the latch circuit, vop2, is a low voltage in the second voltage domain (e.g., vssh) when the reset-latch switch is turned ON.

The voltage translation device 300 also includes a driver circuit. The driver circuit, for the voltage translation device 300 shown in FIG. 3, includes the switching devices P1, P2, P3, P4, N5, and N6. In particular, P1 and P4 are pass gates of the driver circuit. Pass gate, P4, 360 is connected between input switch, N2, and the set-latch switch P7 and passes a voltage from the first voltage domain (e.g., vssl) to turn ON the set-latch switch, P7, 330 when the input switch, N2, is turned ON. Pass gate, P1, is connected between input switch, N1, and the reset-latch switch P8, 340. Pass gate, P1, passes a voltage (e.g., vssl) from the first voltage domain to turn ON the reset-latch switch 340 when the input switch N1 is turned ON.

Figure 5:
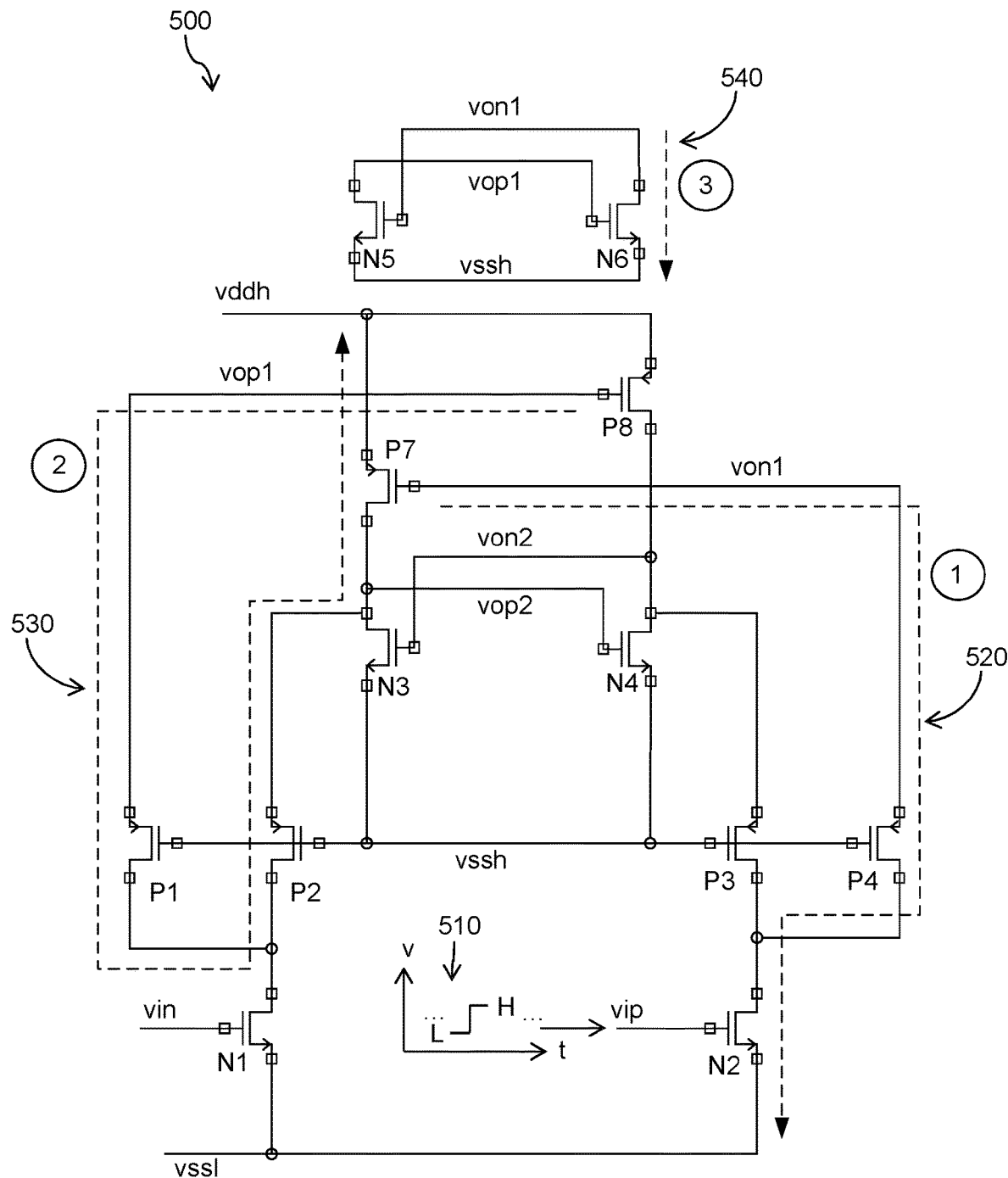
FIG. 5 schematically depicts a low voltage (LV) to high voltage (HV) translation device and its operation according to an implementation of the present disclosure.

The operation of the voltage translator is shown in FIG. 5. As an example, vip is received at gate of the input switch, N2. For this example, the transition of vip from low-to-high is considered. As discussed previously, vin is the compliment of vip and thus transitions from high-to-low. Prior to the transition of vip, the latch 340 of the output circuit 150 has a voltage state in which von2 is high and vop2 is low. Thus, the function of the input circuit 130 and driver circuit 140 at the low-to-high transition of vip in the LV domain is to change this state of the latch so that vop2 follows the low-to-high transition of vip.

The source of N2 is connected to the lower rail voltage of the first voltage domain (i.e., vssl), and the drain of N2 is connected to the drain of P3 and to the drain of pass gate, P4. Thus, when vip transitions to high then NMOS switching device, N2, is turned ON and pulls the drains of PMOS switching devices P3 and P4 to vssl (e.g. ground). Prior to the transition von1 and von2 were high (in the HV power domain), the drains of P3 and P4 were high, and P8 and P3 were ON. Thus, in the prior state of the circuit, the drain of P3 was pulled up, however when N2 is turned on at the transition, N2 is large enough to overdrive the DC path of P8 and P3 to pull the drain of P3 low.

The gate of pass gate, P4, is connected to the lower rail voltage of the second voltage domain (i.e., vssh) and the source of P4 is connected to the gate of set-latch switch, P7. Thus, when N2 is turned on, P4 is overdriven and passes its drain voltage to its source. The drain voltage of P4 can be from a voltage from vssl to vddh rail-to-rail. Accordingly, P4 is known as a pass gate because it passes its drain voltage to its source thus making von1 low when N2 is turned ON. Because the pass gate is overdriven to pass a very low voltage to von1, the latch switching problem for low power supplies described earlier is prevented. In other words, the pass gate is controlled by N2 to pass a voltage (von1) from the first voltage domain that is low enough to switch P7 ON and change the state of the latch.

It should be noted that pass gate P4 does not need to drive a DC current path, and even a small drain current, Id, in P4 can pull down the source of P4. In other words, even when P4 is operated in a subthreshold region it can pass its drain voltage to its source when overdriven by N2 of the input circuit.

When P7 is turned ON, the vop2 is connected to vddh (i.e., pulled high) through P7. In this example, vop2 may be considered the output (i.e., output signal) of the voltage translator that corresponds to the input, vip. Likewise von2 may be considered the output of the voltage translator that corresponds to the input, vin. Because the gate of N4 is controlled by vop2, N4 is turned ON and von2 is connected to vssh (i.e., brought low) through N4. Additionally, drain of P2 is pulled high because the voltage at its source (i.e., vop2=vddh) is brought to a level that is larger than the voltage at its gate (i.e., vssh) by more than the threshold voltage, Vth, of P2 (i.e., P2 turns ON). As a result, vop1 is also pulled high through P1, which turns ON as a result of the drain of P2 being pulled high through P2.

As a final step, the voltage von1 is set to the low voltage of the HV domain (i.e., vssh). In an earlier step, von1 was brought relatively low voltage (e.g., close to or equal to vssl) by the pass gate P4 in order to switch P7. For safe operation, this voltage can be set to the low voltage of the second voltage domain. The switching devices N5 and N6 are used to set the low voltage of the circuit to ensure safe operation. When vop1 is pulled high through P2 and P3, N6 is turned on, which connects von1 to the lower voltage of the HV domain (i.e., vssh).

Thus, the passed voltage may be outside the range of voltages in the second voltage domain. Accordingly, the gate of the set-latch switch can be brought to a relatively low voltage to change the voltage state of the latch.

The passing of vssl to von1 through pass gate, P4, may be thought of as a first step in a three step process performed by the voltage translation device. First, pass gate P4 passes a voltage from a first voltage domain to the gate of P7, then vop1 is pulled-up 530 to a high voltage (i.e., vddh), and finally von1 is set 540 to be the lower rail voltage (e.g., vssh) of the second voltage domain.

The three step process operates similarly for a high-to-low transition of vip. In this case, a low-to-high transition of vin is received at the gate of the input switch, N1, which is connected at its source to the lower rail voltage of the first voltage domain (i.e., vssl) and at its drain to the drain of P2 and the drain of pass gate, P1. The gate of pass gate, P1, is connected to the lower rail voltage of the second voltage domain (i.e., vssh), and the source of P1 is connected to the gate of reset-latch switch, P8. Thus, vop1 is first pulled down to a low voltage outside the second voltage domain through the pass gate P1 and through N1, the von1 is pulled up to vddh through P4, P3, and P8, and finally vop1 is set to vssh in the second voltage domain for safe operation.

Like pass gate, P4, pass gate, P1, does not need to drive a DC current path, and even a small drain current, Id, in P1 can pull down the source of P1. In other words, even when P1 is operated in a subthreshold region it can pass its drain voltage to its source when overdriven by N1 of the input circuit.

Figure 6:
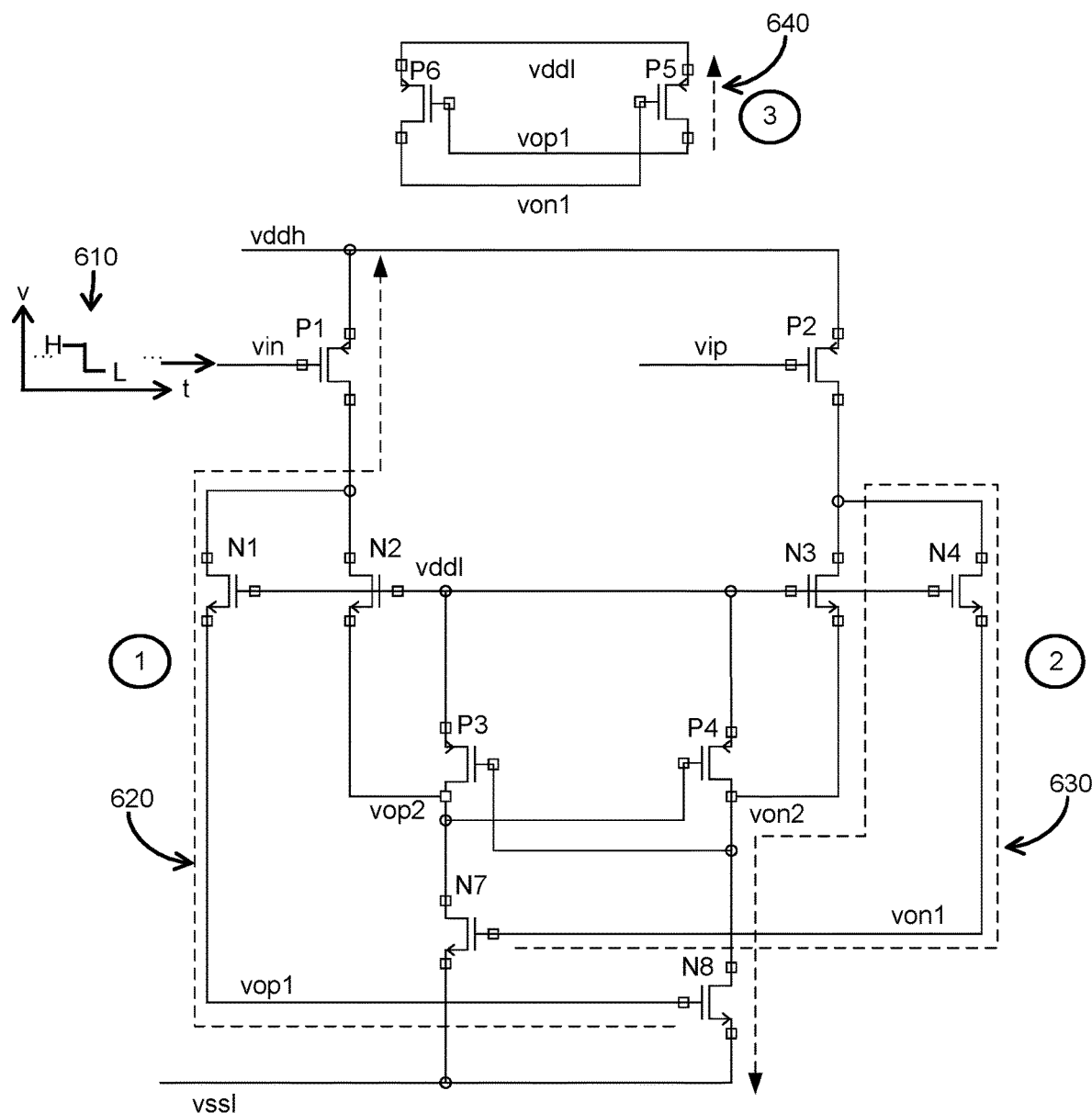
FIG. 6 schematically depicts a HV to LV translation device and its operation according to an implementation of the present disclosure.

FIG. 6 illustrates another embodiment of a voltage translation device, where a HV domain input signal is translated to a LV domain output signal. The three step process described previously is similar except pull-down operations may be replaced with pull-up operations. For example, when vin transitions from high-to-low at the input 610, first vop1 is pulled-up 620 to a relatively high voltage (e.g., close to or equal to vddh) through pass gate N1 and through P1; then von1 is pulled-down 630 through N4, N3, and N8; and finally vop1 is set to the upper rail voltage (i.e., vddl) of the second voltage domain (i.e., the LV domain).

Figure 7:
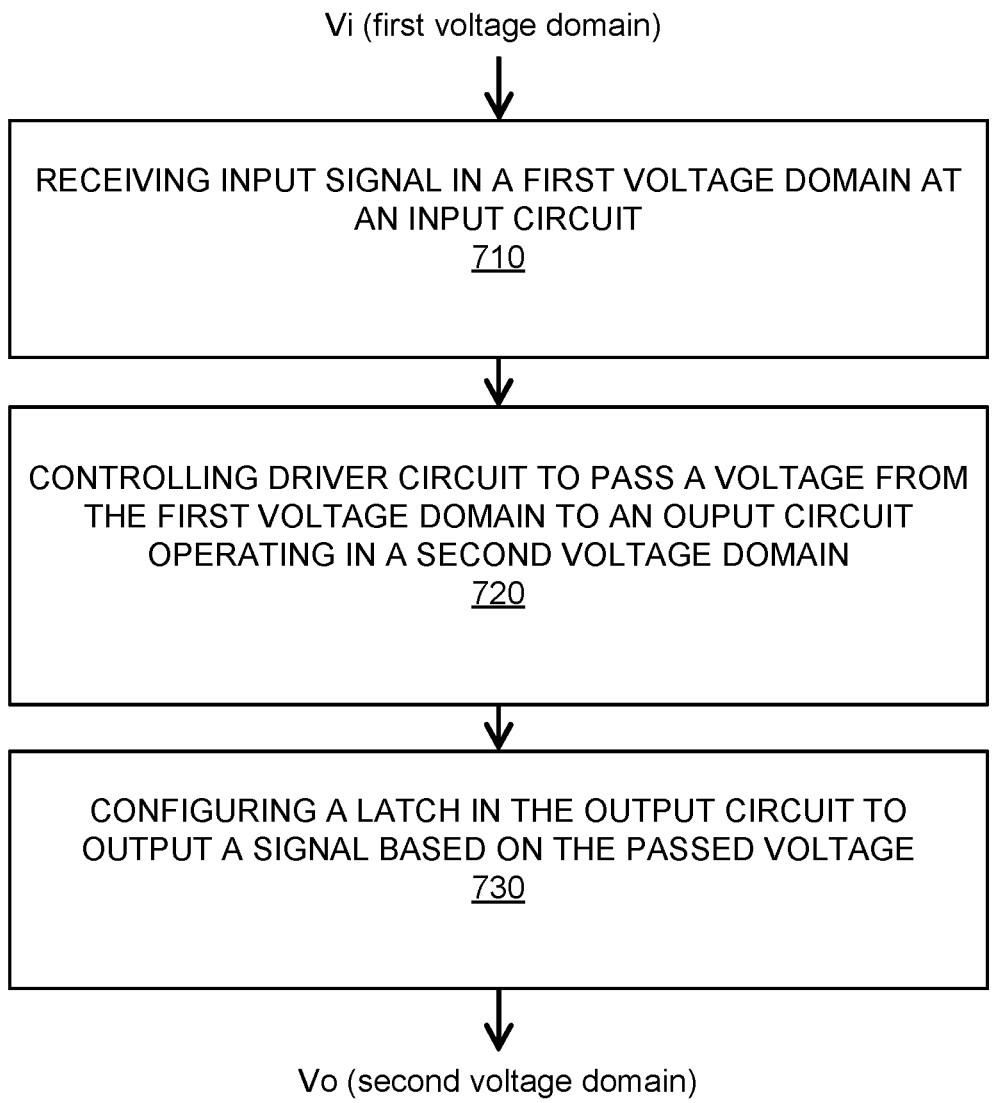
FIG. 7 is a flow chart of a method for voltage translation according to an embodiment of the present disclosure.

A flow chart of a method for voltage translation is shown FIG. 7. As shown, the method includes receiving 710 an input signal in a first voltage domain at an input circuit. The first voltage domain may be a HV domain (e.g., greater than 10 v) or a LV domain (e.g., less than 5V).

In a LV domain, voltages may range from a lower rail voltage, vssl, to an upper rail voltage, vddl. For example, vddl−vssl may be, for example, 1.6 v or 5.5 v with vssl=0 v. In a HV domain, voltages may range, for example, from a lower rail voltage, vssh, to an upper rail voltage, vddh. For example, vddh-vssl may be 1.6 v or 5.5 v with vssh=20 v.

The method also includes controlling 720 a pass gate in a driver circuit to pass a voltage outside the second voltage domain to a latch in an output circuit operating in the second voltage domain. For example, in a LV to HV translator, the pass gate may pass a relatively low voltage (e.g., vssl) to a latch operating in a HV domain, where the passed voltage is outside (i.e., lower) than the range of voltages in the HV domain (e.g., vssh to vddh). Alternatively, in a HV to LV translator, the pass gate may pass a relatively high voltage (e.g., vddh) to a latch operating in a LV domain, where the passed voltage is higher than the range of voltages in the LV domain (e.g., vssl to vddl).

The method also includes switching 730 a switch device (e.g., a PMOS or an NMOS device) in the latch of the output circuit based on the passed voltage. Because the passed voltage is outside the second voltage domain, the switching operation will be triggered (e.g., is guaranteed) even when the range of voltages in the second voltage domain is small (e.g., less than 2 volts). After switching, the node (e.g., gate of the latch switch) receiving the passed voltage may be set to be a voltage within the second voltage domain for safe operation.

Some embodiments disclosed may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC), and/or so forth.

Switching devices included in the voltage translator can be or can include a metal-oxide-semiconductor field-effect transistor (MOSFET) device (e.g., N-channel MOSFET (NMOS) device, P-Channel MOSFET (PMOS) device, a bipolar junction transistor (BJT), etc.). The types of devices used for switching in the embodiments described are reflected in the figures by the symbols and nomenclature used.

In the specification and/or figures, typical embodiments have been disclosed. The present disclosure is not limited to such exemplary embodiments. Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

The invention claimed is:

1. An apparatus, comprising:
   an input circuit, operating in a first voltage domain, configured to receive an input signal;
   an output circuit, operating in a second voltage domain, and including a latch circuit, the first voltage domain and the second voltage domain each spanning a voltage range less than a translation voltage separating the first voltage domain and the second voltage domain; and
   a driver circuit controlled by the input circuit to pass a voltage from the first voltage domain to the latch circuit, the passed voltage triggers the latch circuit to output an output signal in the second voltage domain according to the input signal in the first voltage domain.

2. The apparatus according to claim 1, wherein:
   the first voltage domain includes voltages spanning a lower rail voltage of the first voltage domain and an upper rail voltage of the first voltage domain; and
   the second voltage domain includes voltages spanning a lower rail voltage of the second voltage domain and an upper rail voltage of the second voltage domain.

3. The apparatus according to claim 2, wherein the difference between the upper rail voltage of the first voltage domain and the lower rail voltage of the first voltage domain is less than 2 volts.

4. The apparatus according to claim 2, wherein the difference between the upper rail voltage of the second voltage domain and the lower rail voltage of the second voltage domain is less than 2 volts.

5. The apparatus according to claim 2, wherein the lower rail voltage of the first voltage domain and the upper rail voltage of the first voltage domain are lower than the lower rail voltage of the second voltage domain and the upper rail voltage of the second voltage domain.

6. The apparatus according to claim 5, wherein the passed voltage is the lower rail voltage of the first voltage domain.

7. The apparatus according to claim 2, wherein the lower rail voltage of the first voltage domain and the upper rail voltage of the first voltage domain are higher than the lower rail voltage of the second voltage domain and the upper rail voltage of the second voltage domain.

8. The apparatus according to claim 7, wherein the passed voltage is the upper rail voltage of the first voltage domain.

9. The apparatus according to claim 1, wherein the input circuit includes:
a first input switch that is turned ON when the input signal is a high voltage in the first voltage domain and turned OFF when the input signal is low voltage in the first voltage domain; and
a second input circuit switch that is turned ON when the input signal is the low voltage in the first voltage domain and turned OFF when the input signal is the high voltage in the first voltage domain.

10. The apparatus according to claim 9, wherein the latch circuit includes:
a set-latch switch, wherein the output signal of the latch circuit is a high voltage in the second voltage domain when the set set-latch switch is turned ON; and
a reset-latch switch, wherein the output signal of the latch circuit is a low voltage in the second voltage domain when the reset-latch switch is turned ON.

11. The apparatus according to claim 10, wherein the driver circuit includes:
a first pass gate connected between first input switch and the set-latch switch that passes the voltage from the first voltage domain to turn ON the set-latch switch when the first input switch is turned ON; and
a second pass gate connected between the second input switch and the reset-latch switch that passes the voltage from the first voltage domain to turn ON the reset-latch switch when the second switch is turned ON.

12. A method, comprising:
receiving an input signal at an input circuit operating in a first voltage domain;
controlling, based on the input signal, a driver circuit to pass a voltage from the first voltage domain to an output circuit operating in a second voltage domain, the first voltage domain and the second voltage domain each spanning a voltage range less than a translation voltage separating the first voltage domain and the second voltage domain; and
configuring, based on the passed voltage, a latch circuit in the output circuit, to output an output signal in the second voltage domain according to the input signal in the first voltage domain.

13. The method according to claim 12, wherein:
the first voltage domain includes voltages spanning a lower rail voltage of the first voltage domain and an upper rail voltage of the first voltage domain; and wherein
the second voltage domain includes voltages spanning a lower rail voltage of the second voltage domain and an upper rail voltage of the second voltage domain.

14. The method according to claim 13, wherein:
the difference between the upper rail voltage of the first voltage domain and the lower rail voltage of the first voltage domain is less than 2 volts, and
the difference between the upper rail voltage of the second voltage domain and the lower rail voltage of the second voltage domain is less than 2 volts.

15. The method according to claim 13, wherein the controlling, based on the input signal, a driver circuit includes:
turning ON a first input circuit switch in the input circuit to connect a first pass gate in the driver circuit to the voltage in the first voltage domain when the input signal is a high voltage in the first voltage domain; and
turning ON a second input circuit switch in the input circuit to connect a second pass gate in the driver circuit to the voltage in the first voltage domain when the input signal is a low voltage in the first voltage domain.

16. The method according to claim 15, wherein the upper rail voltage of the first voltage domain and the lower rail voltage of the first voltage domain are lower than the upper rail voltage of the second voltage domain and the lower rail voltage of the second voltage domain.

17. The method according to claim 15, wherein the upper rail voltage of the first voltage domain and the lower rail voltage of the first voltage domain are higher than the upper rail voltage of the second voltage domain and the lower rail voltage of the second voltage domain.

18. The method according to claim 15, wherein the configuring, based on the passed voltage, a latch circuit in the output circuit includes:
passing, via a first pass gate connected between the first input circuit switch and a set-latch switch of the latch circuit, the voltage from the first voltage domain to turn ON the set-latch switch, wherein the output signal of the latch circuit is a high voltage in the second voltage domain when the set set-latch switch is turned ON; and
passing, via a second pass gate connected between the second input circuit switch and a reset-latch switch of the latch circuit, the voltage from the first voltage domain to turn ON the reset-latch switch, wherein the output signal of the latch circuit is a low voltage in the second voltage domain when the reset set-latch switch is turned ON.

19. A system for voltage translation, the system comprising:
an input circuit operating in a first voltage domain that is configured to receive an input signal;
a latch circuit operating in a second voltage domain, the first voltage domain and the second voltage domain each spanning a voltage range less than a translation voltage separating the first voltage domain and the second voltage domain; and
a first pass gate and a second pass gate each being connected between the input circuit and the latch circuit, the first pass gate and the second pass gate being controlled by the input circuit to pass a voltage from the first voltage domain to set or reset the latch circuit to a voltage in the second voltage domain according to the input signal.

20. The system for voltage translation according to claim 19, wherein the latch comprises:
a set-latch switch with a gate connected only to the first pass gate; and
a reset-latch switch with a gate connected only to the second pass gate.

* * * * *